US008346527B2

(12) United States Patent
Walter et al.

(10) Patent No.: US 8,346,527 B2
(45) Date of Patent: Jan. 1, 2013

(54) SIMULATING AN OPERATION OF A DIGITAL CIRCUIT

(75) Inventors: Joerg Walter, Tuebingen (DE); Lothar Felten, Hauset (BE); Volker Urban, Boeblingen (DE); Norbert Schumacher, Neuhausen (DE); Marcel Naggatz, Coswig (DE)

(73) Assignee: International Business Machines Corporation, Armonk, NY (US)

( * ) Notice: Subject to any disclaimer, the term of this patent is extended or adjusted under 35 U.S.C. 154(b) by 881 days.

(21) Appl. No.: 12/351,201

(22) Filed: Jan. 9, 2009

(65) Prior Publication Data

US 2009/0182545 A1    Jul. 16, 2009

(30) Foreign Application Priority Data

Jan. 14, 2008   (EP) ..................... 08100433

(51) Int. Cl.
    *G06F 17/50*      (2006.01)
(52) U.S. Cl. .............. 703/14; 703/15; 714/724
(58) Field of Classification Search ............. 703/14, 703/15, 16; 716/6, 108; 714/724
    See application file for complete search history.

(56) References Cited

U.S. PATENT DOCUMENTS

| | | | | |
|---|---|---|---|---|
| 5,263,149 A * | 11/1993 | Winlow | ............ | 703/15 |
| 5,384,720 A * | 1/1995 | Ku et al. | ............ | 703/16 |
| 5,956,256 A * | 9/1999 | Rezek et al. | ............ | 716/108 |
| 6,088,821 A * | 7/2000 | Moriguchi et al. | ............ | 714/724 |
| 7,131,093 B1 * | 10/2006 | Aden | ............ | 716/108 |
| 7,844,438 B1 * | 11/2010 | Verghese et al. | ............ | 703/14 |
| 2008/0072197 A1 * | 3/2008 | Ja et al. | ............ | 716/6 |
| 2008/0263489 A1 * | 10/2008 | Canada et al. | ............ | 716/6 |

OTHER PUBLICATIONS

Design methodology for IBM ASIC products by J.J. Engel et al. pp. 387-406 Copyright 1996 by International Business Machines Corporation.
Configurable system simulation model build comprising packaging design data H.W. Anderson et al. pp. 367-378 Copyright 2004 by International Business Machines Corporation.
The JavaCC FAQ Maintained by Theodore S. Norvell Computer and Electrical Engineering Memorial University of Newfoundland theo at engr.mun.ca Jun. 19, 2007 17 Pages.
Standard Delay Format Specification Version 3.0 May 1995 Open Verilog International 104 pages.

* cited by examiner

*Primary Examiner* — Kandasamy Thangavelu
(74) *Attorney, Agent, or Firm* — John E. Campbell

(57) ABSTRACT

A method for simulating an operation of a digital circuit (01) is described. The method utilizes cycle simulation, wherein in a cycle based simulation model (34) of the digital circuit (01) components (02, 03, 04, 05) of the digital circuit (01) are clocked synchronously every cycle (19) of a functional clock (Clk). According to the invention, real digital circuit (01), i.e. chip or combinatorial logic (01), timing information is included in the cycle simulation by inserting delay latches (15, 16, 17) into the cycle based simulation model (34) of the digital circuit (01), wherein a non-functional clock (Sim clock) is used to clock the delay latches (15, 16, 17), so that each delay latch (15, 16, 17) delays the propagation of a signal (I, J, K) by a cycle (20) of the non-functional clock (Sim clock).

20 Claims, 8 Drawing Sheets

(State of the Art)

SIMULATING AN OPERATION OF A DIGITAL CIRCUIT

FIELD OF THE INVENTION

The invention relates to logic simulation of digital circuits.

BACKGROUND OF THE INVENTION

Logic simulation is the use of a computer program to simulate an operation of a digital circuit i.e. a chip or a combinatorial logic. Thereby two simulation types are applied: Event simulation and cycle simulation.

Event simulation allows the design to contain timing information—the delay needed for a signal to travel from one place to another. During simulation, signal changes are tracked in form of events. A change at a certain time triggers an event after a certain delay. Events are sorted by the time when they will occur, and when all events for a particular time have been handled, the simulated time is advanced to the time of the next scheduled event. How fast an event simulation runs depends on the number of events to be processed, i.e. on the amount of activity in the model.

In cycle simulation it is not possible to specify delays. In cycle simulation a cycle-accurate model is used and every gate is evaluated in every cycle. Cycle simulation therefore runs at a constant speed, regardless of activity in the model.

While event simulation can provide some feedback regarding signal timing, it is not a replacement for static timing analysis. On the other hand, functional verification of logic circuitry using cycle simulation does not include any timing information like signal and gate delays. For this, a separate process is in place using timing assertions. However, often cases occur where timing assertions were wrong and the chip hardware fails due to marginal timing. Disadvantageously timing fails cannot be detected in chip cycle simulation as it does not use any notion of time. To recreate timing fails, event simulators are used, which use either standard delays for gates and wires or use real chip timing information. A drawback of this is that two verification environments need to be set up and maintained, which causes significant overhead. In addition, event simulation on large designs is very slow and sometimes impossible due to memory limitation or runtime constraints.

SUMMARY OF THE INVENTION

It is therefore an object of the invention to provide an improved logic simulation method. Particularly, it is an object of the invention to provide a method for simulating operation of a digital circuit, which method utilizes the advantages of cycle simulation but also considers real chip timing information.

The object of the invention is met by a method for simulating an operation of a digital circuit. The method utilizes cycle simulation, wherein in a cycle based simulation model of the digital circuit components of the digital circuit are clocked synchronously every cycle of a functional clock. According to the invention, real digital circuit timing information, i.e. real chip or real combinatorial logic timing information, is included in the cycle simulation by generation of a simulation model comprising timing information by inserting delay latches into the cycle based simulation model of the digital circuit. A non-functional clock is used to clock the delay latches, so that each delay latch delays the propagation of a signal by a cycle of the non-functional clock.

The method according to the invention allows to back-annotate real chip timing information into chip cycle simulation. This is performed by including real chip timing information into cycle simulation. For this preferably a non-functional to functional clock ratio, preferably in form of a simulator clock to logic or chip clock ratio, is adjusted, preferably raised, in order to preferably divide a functional clock cycle into several non-functional clock cycles. The preferably faster non-functional clock now can be used to clock delay latches in sub-cycles of the functional chip timing. Depending on the clock ratio, timing delays can be modeled precisely with the granularity required.

The advantages of the invention over the state of the art are achieved by performing timing simulation using a cycle simulator instead of an event simulator, which results in an improved performance. Also, as the timing information is modeled in the gate level model of a chip, it is possible to run the simulation on an accelerator. This not only improves simulation performance by several magnitudes, but also makes the simulation speed almost independent on the simulation model size at least until the capacity of the accelerator machine is reached.

Preferably, the functional clock is generated by delaying the non-functional clock in order to have a functional clock with cycles subdivided into an appropriate number of non-functional clock cycles.

According to a preferred embodiment of the invention, the non-functional clock has clock cycles equivalent to the smallest delay time of a component of the digital circuit.

According to another preferred embodiment of the invention, the non-functional clock has clock cycles equivalent to the smallest difference in delay times of at least two components of the digital circuit.

According to a particularly preferred embodiment of the invention, the delay latches are inserted into the cycle based simulation model by inserting them into a signal path of the digital circuit.

Preferably, the delay latches are inserted according to timing information specified by a timing report generated by physical design (PD).

According to a preferred embodiment of the invention, the method is used as a debug vehicle in case a digital circuit fails due to timing problems.

In a particularly preferred embodiment of the invention, said method is performed by a computer program product stored on a computer usable medium comprising computer readable program means for causing a computer to perform the method mentioned above, when said computer program product is executed on a computer.

BRIEF DESCRIPTION OF THE DRAWINGS

The foregoing, together with other objects, features, and advantages of this invention can be better appreciated with reference to the following specification, claims and drawings, with:

DETAILED DESCRIPTION

Figure 1:
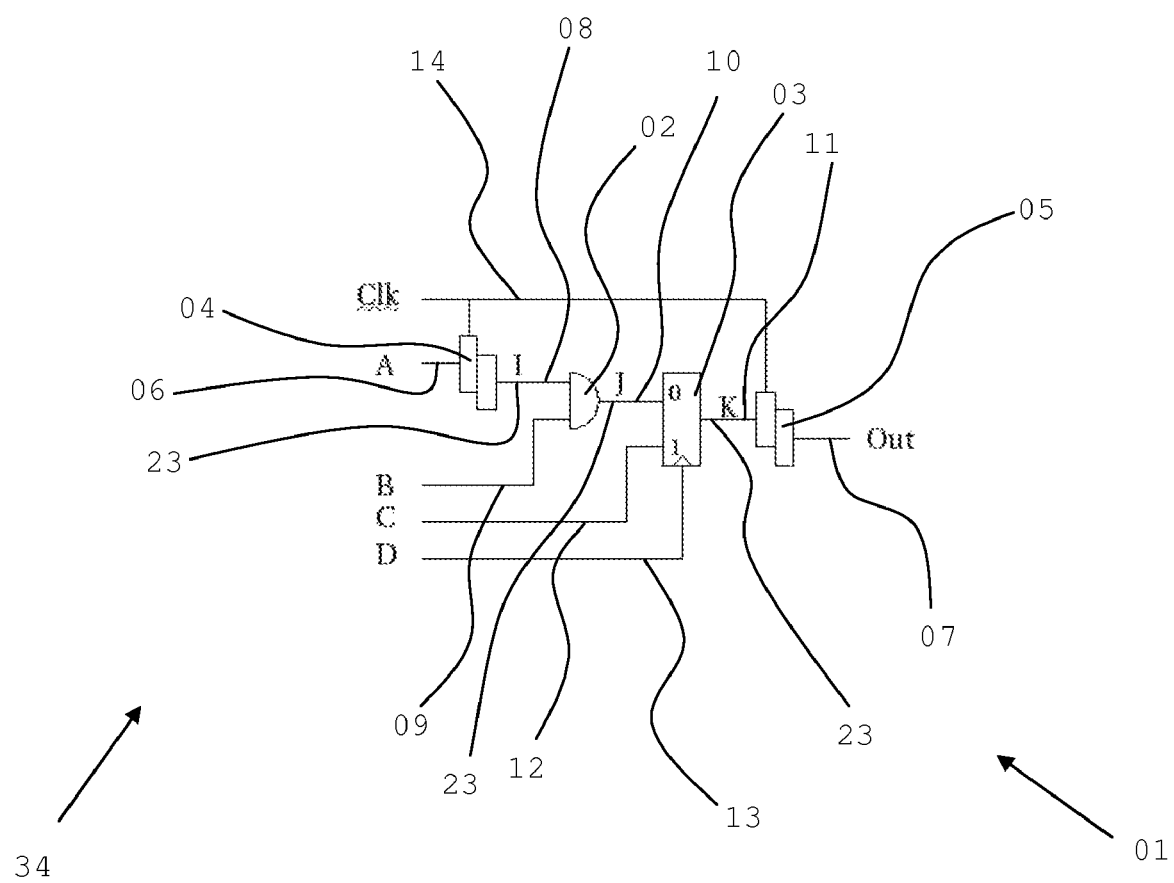
FIG. 1 showing a circuit diagram of a combinatorial logic to be simulated.

A combinatorial logic 01 shown in FIG. 1 consists of an AND gate 02, a multiplexer 03 and two latches 04, 05, a first one 04 at an input 06 of the combinatorial logic 01 and a second one 05 at an output 07 of the combinatorial logic 01. The first latch 04 and the AND gate 02 are connected with each other via the connection 08 that is the output 08 of the latch 04 as well as a first input 08 of the AND gate 02. The AND gate 02 and the multiplexer 03 are connected with each other via a connection 10 that is the output 10 of the AND gate 02 as well as a first input 10 of the multiplexer 03. The AND gate 02 further has a second input 09. The multiplexer 03 and the second latch 05 are connected with each other via a connection 11 that is the output 11 of the multiplexer 03 as well as an input 11 of the second latch 05. The multiplexer 03 further has a second input 12 plus a control input 13. An input 06 of the first latch 04 is the input of the combinatorial logic 01 and an output 07 of the second latch 05 is the output 07 of the combinatorial logic 01. Both latches 04, 05 have a clock input 14 each connected via a clock circuit 14 with a clock generator logic (not shown).

The following signals are transmitted via the following connections and/or in- and/or outputs:

- a logic clock signal Clk via the clock circuit 14 to the clock inputs 14 of the latches 04, 05;
- an input signal A via the input 06 of the combinatorial logic 01 and the first latch 04 respectively;
- an input signal B via the second input 09 of the AND gate 02;
- an input signal C via the second input 12 of the multiplexer 03;
- a control signal D via the control input 13 of the multiplexer 03;
- a signal I via the connection 08 from the output 08 of the first latch 04 to the first input 08 of the AND gate 02;
- a signal J via the connection 10 from the output 10 of the AND gate 02 to the first input 10 of the multiplexer 03;
- a signal K via the connection 11 from the output 11 of the multiplexer 03 to the input 11 of the second latch 05; an output signal Out via the output 07 of the combinatorial logic 01 and the second latch 05 respectively.

For simulation this logic 01 is compiled into a simulation model 34.

According to the state of the art in cycle simulation a simulation cycle consists of calculation of the combinatorial logic 01 combined with a latch update, where the input 06 of the latch 04 is propagated to the output 08 of the latch 04 and the input 11 of the latch 05 is propagated to the output 07 of the latch 05.

Figure 2:
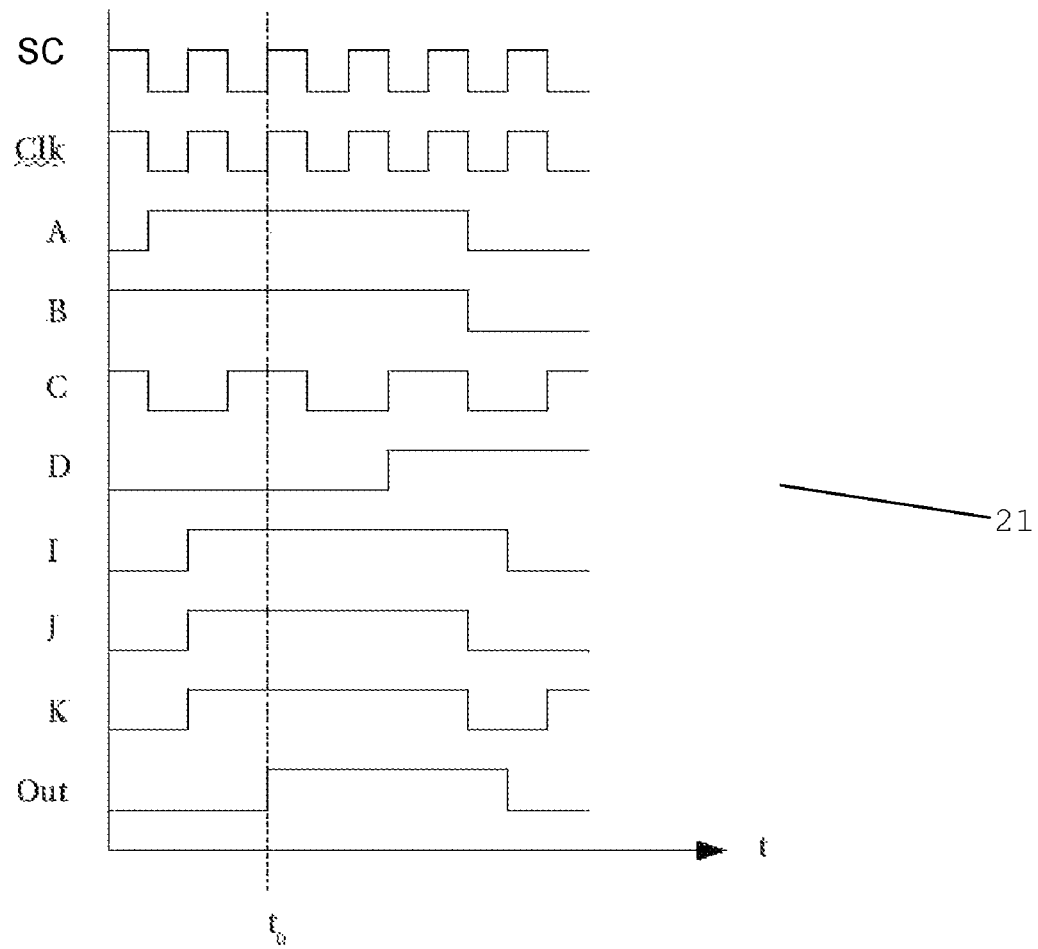
FIG. 2 showing a timing diagram representing a scheme of signal characteristics versus time in cycle simulation according to the state of the art.

Regarding FIG. 2 showing a timing diagram 21 representing signal characteristics versus time in cycle simulation according to the state of the art, the latch update happens with the rising edge of a simulator clock signal Sc. To simplify matters in FIG. 2, the logic clock signal Clk is equivalent to the simulator clock signal Sc. When the input signal A of the latch 04 is raised to a logic '1' the signal I turns to '1' with the rising edge of the logic clock signal Clk. Then the combinatorial logic 01 is evaluated, so signals I, J and K switch to '1'. With the next rising clock edge at to, the output signal Out also switches to '1'.

The concept of cycle simulation according to the state of the art uses an abstracted view in order to improve simulation performance. Thereby, a simulation model 34 is used which emulates the combinatorial logic 01 by emulating the components 02, 03, 04, 05 of the combinatorial logic 01 but without considering timing delays. No timing information is considered in any way, so it is impossible to determine if a signal change at the output 08 of the first latch 04 is propagated in time to the input 11 of the second latch 05. This is eponymous for the term 'functional verification'.

Figure 3:
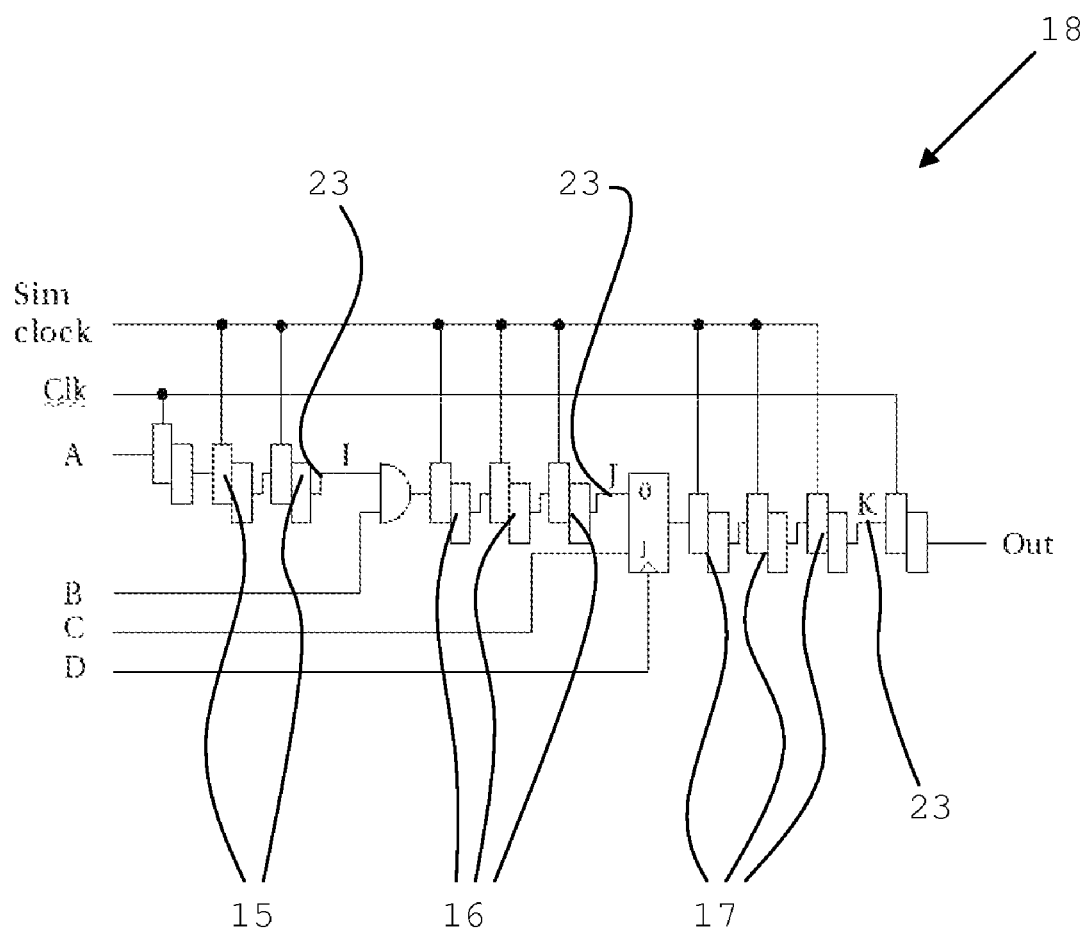
FIG. 3 showing a simulation model of the combinatorial logic of FIG. 1 which is adapted according to the invention.

In contrast, the invention allows to model timing delays. To achieve this delay, latches 15, 16, 17 are inserted into the simulation model 34 of the combinatorial logic 01 shown in FIG. 1. Doing so, a simulation model 18 shown in FIG. 3 is achieved. The delay latches 15, 16, 17 are clocked via the simulator clock signal Sim clock. The remaining elements of the combinatorial logic 01 are unchanged and thus not explained again.

Figure 4:
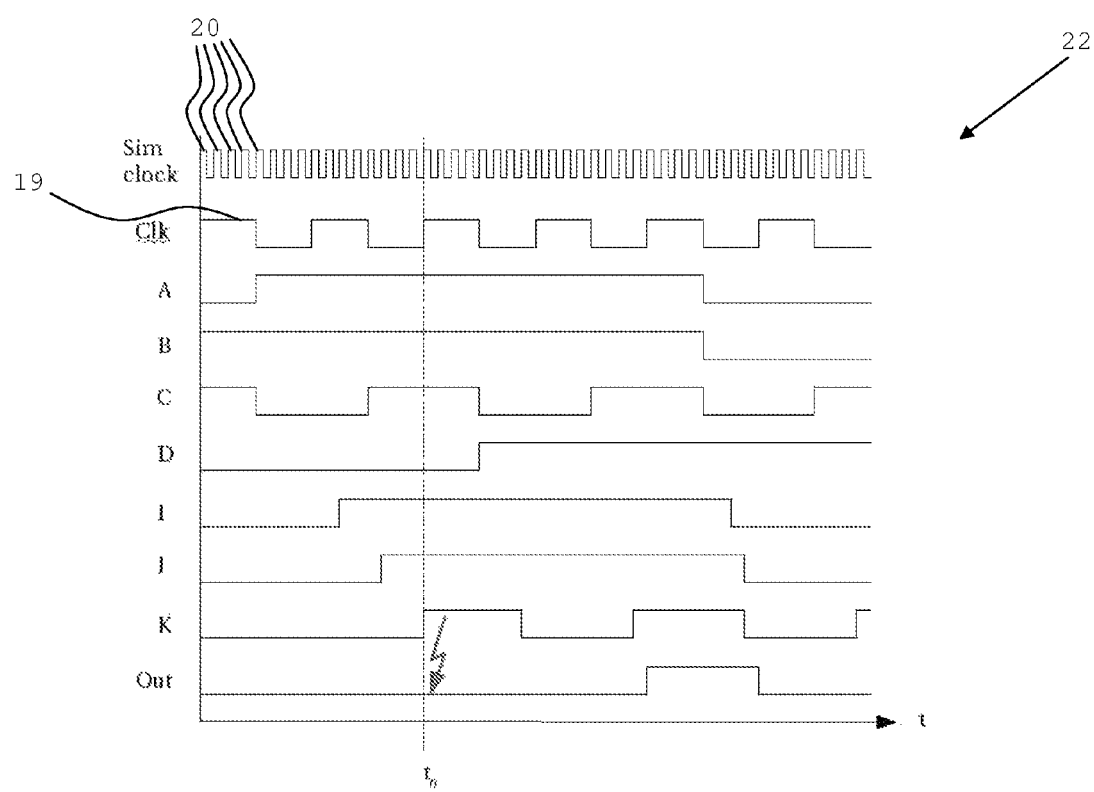
FIG. 4 showing a timing diagram representing a scheme of signal characteristics versus time in cycle simulation according to the invention.

To model timing delays, according to the invention the simulator clock signal Sim clock is divided by n to generate the logic clock signal Clk, so that a clock cycle 19 of the logic clock signal Clk is divided into multiple cycles 20 of the simulator clock signal Sim clock. In the example shown in FIG. 4, a clock cycle 19 of the logic clock signal Clk consists of eight clock cycles 20 of the simulator clock signal Sim clock. Then timing delays 15, 16, 17 in form of the delay latches 15, 16, 17 are inserted into the signal path 23, which is formed by the connections 08, 10, 11, according to timing information specified by a timing report generated by physical design (PD) (FIG. 3). This ensures that real chip timing is used. For clarity, only the signal path between the latches 04, 05 is modified. The delay latches 15, 16, 17 are clocked by the simulator clock signal Sim clock, so each delay latch 15, 16, 17 delays the propagation of a signal by a cycle 20 of the simulator clock signal Sim clock. With the same sequence of input signals A, B, C, D, the timing diagram 22 in FIG. 4 shows that signal K is delayed, so that the signal change is not propagated to the output 07, resulting in a different behavior of the output 07 at time $t_0$ of the real logic represented by the simulation model 18 in FIG. 3 compared to the model of the combinatorial logic 01 shown in FIG. 1 that is used in functional verification according to the state of the art.

Summarized, the invention uses cycle simulation with modeled timing delays, which timing delays are modeled by delay latches 15, 16, 17 inserted in the signal path 23 of the simulation model 18. Further a non-functional or delay clock formed by a sub-divided simulator clock signal Sim clock is used to clock the delay latches 15, 16, 17 in sub-cycles of the functional clock formed by the logic clock signal Clk. Advantages over the state of the art besides the ability to model timing delays in cycle simulation are that depending on the ratio of delay clock to the functional or chip clock, timing delays can be modeled precisely with a granularity required. Further, the resulting simulation model 18 can be run in a cycle simulator as well as on an accelerator machine.

Figure 5:
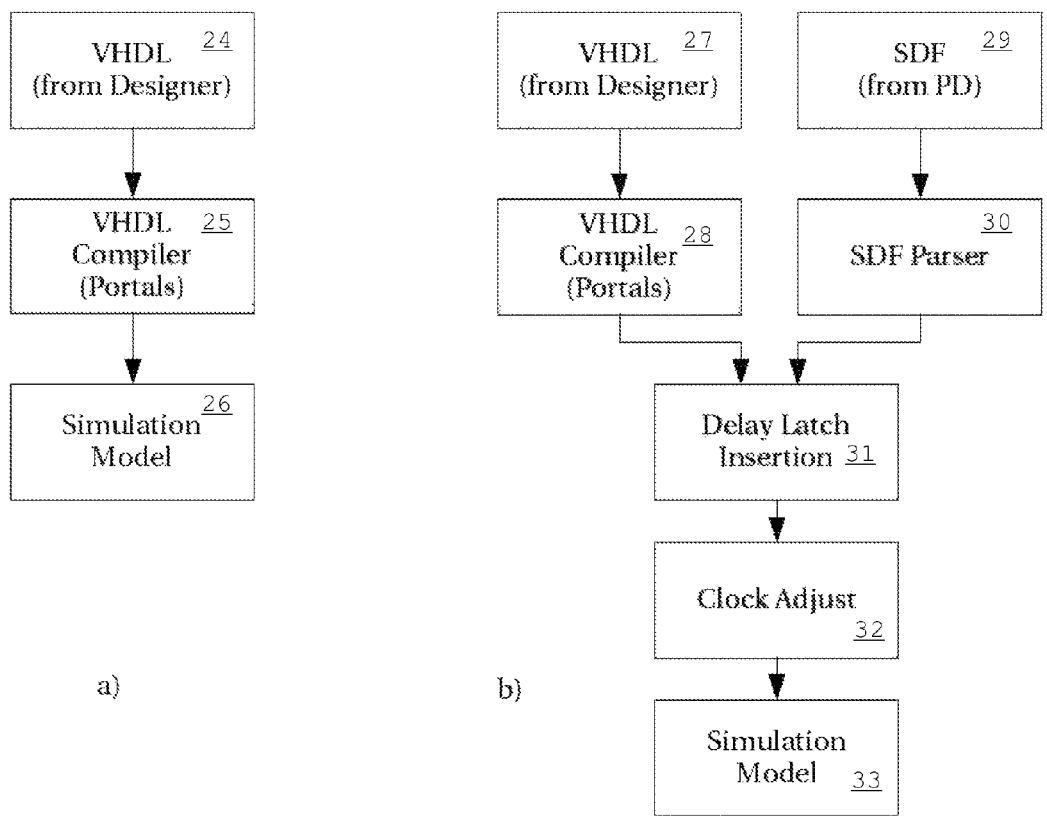
FIG. 5 showing a process flow of a cycle simulation according to the state of the art (FIG. 5*a*) and a process flow of a cycle simulation according to the invention (FIG. 5*b*)

FIG. 5 shows a process flow of a cycle simulation according to the state of the art (FIG. 5*a*) and a process flow of a cycle simulation according to the invention (FIG. 5*b*).

In FIG. 5*a*) on the left, a regular tools flow is shown. In a first step 24 a Very High Speed Integrated Circuit Hardware Description Language (VHDL) input file is available. In a second step 25 the VHDL file is compiled using a VHDL compiler that generates a regular simulation model, which finally is available in a third step 26.

In FIG. 5b) on the right, in a first step 27 also a VHDL input file is available. This VHDL input file in a second step 28 is also compiled using a VHDL compiler. The second step preferably delivers the same regular simulation model like the second step 25 of the regular tools flow. This regular simulation model is regarded as an intermediate or cycle based simulation model. In a third step 29 a Standard Delay Format (SDF) timing information from PD is available, preferably simultaneous to the first step 27. SDF is described in "Standard Delay Format Specification Version 3.0", May 1995, published by Open Verilog International. For the availability of the timing information see for example J. J. Engel et al., "Design methodology for IBM ASIC products", IBM J. Res. & Dev., Vol. 40, No. 4, July 1996. The SDF timing information in a fourth step 30 is parsed by a SDF parser 30 to extract timing information for signals and components. The fourth step 30 preferably is also simultaneous to the second step 28. Depending on the extracted timing information, in a fifth step 31 an appropriate number of delay latches 15, 16, 17 is inserted in the intermediate simulation model. Then in a sixth step 32 a clock adjust stages connects the delay latches 15, 16, 17 with the delay clock, i.e. with the simulator clock signal Sim clock, and inserts a clock divider required to generate the chip clock, i.e. the logic clock signal Clk. Finally in a seventh step a simulation model including timing information, like e.g. the simulation model 18, is available.

Depending on the resolution required to model the timing delays, chip clock may be several magnitudes lower than simulator clock speed. E.g. for a 1 ns chip cycle time, which is equivalent to a 1 GHz chip clock, dividing the simulator clock signal Sim clock by a factor of 1000 would result in a smallest viable delay of 1 ps. This slows down simulation speed by a factor of 1000, while at the same time model size increases by the number of latches inserted to model timing behavior. These disadvantages are more than outweighed by the fact that this timing simulation can be run on an accelerator machine. Thereby it has to be considered that an accelerator machine is several magnitudes faster than a software simulator run on a workstation. In addition, the simulation model is calculated in parallel by a large number of processors, so simulation performance depends much less on model size rather than software simulation. As long as the model size is within the capacity of the accelerator machine, simulation speed only varies within the same order of magnitude. In contrast, event simulators do not run on accelerator machines, so they suffer from model size problems as well as simulation runtime problems, often making chip or combinatorial logic circuitry timing simulation impossible.

It is important to mention that the invention preferably can be used as a debug vehicle in case a chip fails due to timing problems. This may be caused by missing or wrong timing assertions. In this case it is necessary to identify the root cause of the problem by reproducing the failure in simulation and to verify a fix by re-running the test to check that the problem does not show up anymore.

For this type of problems event simulation very often is not a suitable means because of time, i.e. slow performance, and resource constraints, i.e. memory usage. The method according to the invention can be used to achieve the same results with much better performance and less resource consumption.

Figure 6:
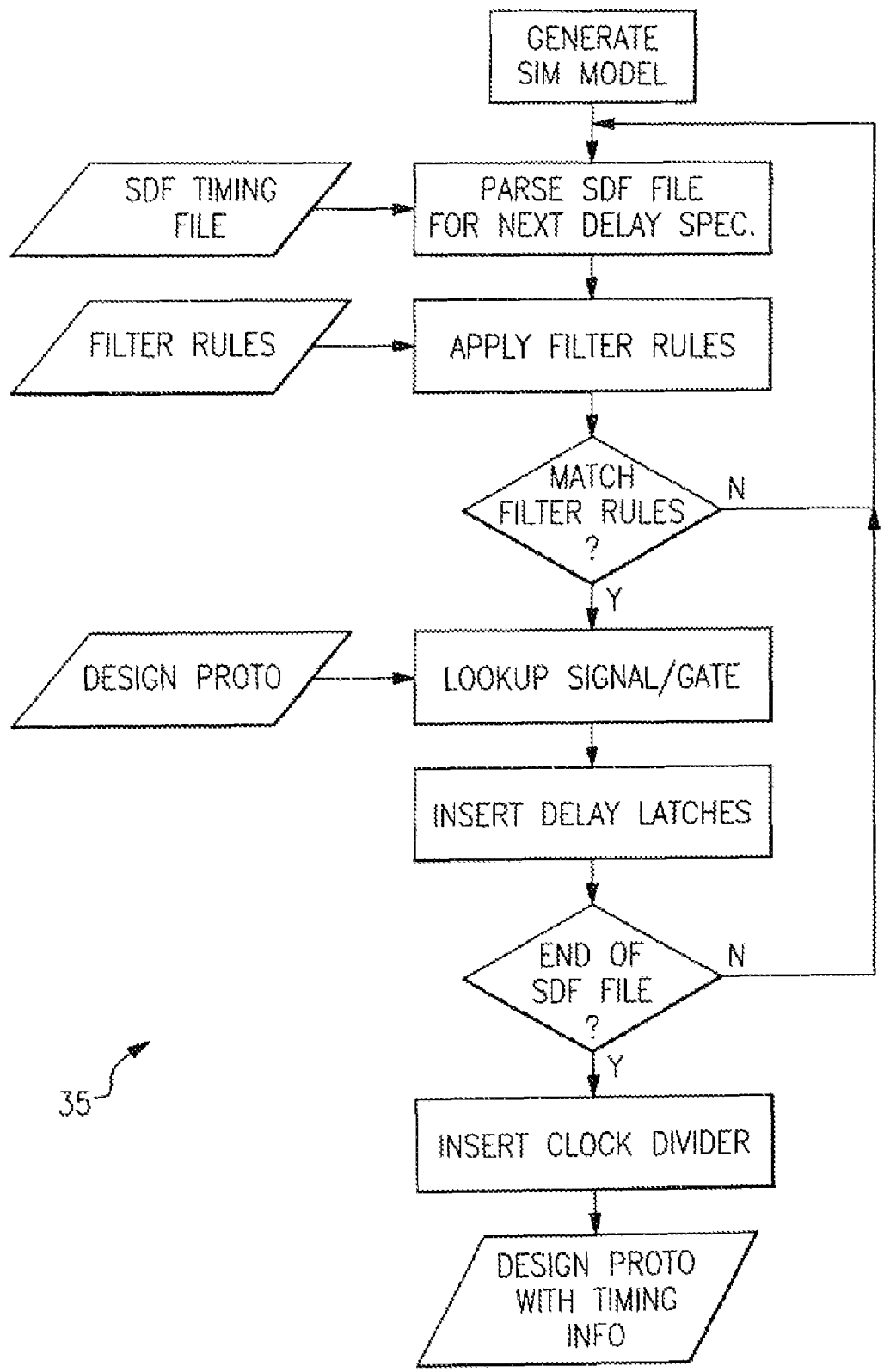
FIG. 6 showing a workflow to generate a simulation model containing timing information.

The SDF parser preferably is generated from a parser generation tool called JavaCC (JAVA® Compiler Compiler). JavaCC is described in T. S. Norvell, "The JavaCC FAQ", published by the Computer and Electrical Engineering Department of the Memorial University of Newfoundland, Jun. 19, 2007 and is incorporated herein by reference. JavaCC reads a grammar specification describing the SDF file syntax and converts this description into a Java program. FIG. 6 shows a workflow 35 to generate a simulation model containing timing information.

The SDF file consists of delay specifications for interconnections and gates of the chip to be verified. A typical delay specification may look like this:

```
(CELL (CELLTYPE "fsp1" )
 (INSTANCE)
 (DELAY
  (ABSOLUTE
   (INTERCONNECT cell1_out  cell2_in  ( 0.012 ) )
  )
 )
)
```

For a timescale of 1 ns this means that the interconnection between cell1_out and cell2_in causes a delay of 12 ps, i.e. 0.012 ns. If the functional clock cycle is 1 ns at a 1 GHz frequency and a functional clock cycle is split into 1000 sub-cycles, resulting in a resolution of 1 ps, the interconnection above would require the insertion of twelve delay latches. In order to reduce the number of latches, it is possible to filter out only the interconnections and gates of interest by application of filter rules using regular expressions. Another method would be to reduce the granularity by e.g. sub-cycle resolution. For example, by dividing the functional cycle by a factor of 100, only one delay latch would be necessary. The disadvantage of such an approach would be a reduced precision in timing calculation which may cause the problem to disappear. By stepping through the SDF file, the parser stops at appropriate delay specifications, depending e.g. on the filter rules mentioned above. As a semantic action of a matching rule of the SDF grammar, the parser looks up the signal in the Design Proto corresponding to the delay specification in the SDF file. Using the Bugspray mechanism, the interconnection is separated and the required number of delay latches is inserted. Bugspray is described in H. W. Anderson et al., "Configurable system simulation model build comprising packaging design data", IBM J. Res. & Dev., Vol. 48, No. 3/4, May/July 2004 and is incorporated herein by reference.

The following VHDL code illustrates the latch insertion process using Bugspray. Thereby Bugspray commands are preprocessed VHDL comments within a "—!! Bugspray" and "—!! END Bugspray" block):

```
library IEEE;
use IEEE.std_logic_1164.all;
entity DLY_LT_SAMPLE is
port (
SOURCE_PIN   : in std_logic;
SINK_PIN     : out std_logic
);
end entity DLY_LT_SAMPLE;
--!! Bugspray
--!! DESIGN ENTITY : TARGET_ENT.TAREGT_ARCH;
--!! INPUTS
--!! SOURCE_PIN =>
ORIGINAL_VHDL_SIGNAL_OR_PORT_NAME_TO_RETRIEVE;
--!! END INPUTS;
--!! DRIVER OUTPUTS
--!! SINK_PIN =>
ORIGINAL_VHDL_SIGNAL_OR_PORT_NAME_TO_DRIVE;
--!! END DRIVER OUTPUTS;
--!! END BugSpray
architecture ARC_DLY_LT_SAMPLE of DLY_LT_SAMPLE is
```

-continued

```
begin
delay the signal by one simulation cycle
SIM_DLY : entity WORK.TEXDELAY
port map (
A    => SOURCE_PIN,
Z    => SINK_PIN
);
end architecture ARC_DLY_LT_SAMPLE;
```

This is repeated for all delay specifications in the SDF file.

Figure 7:
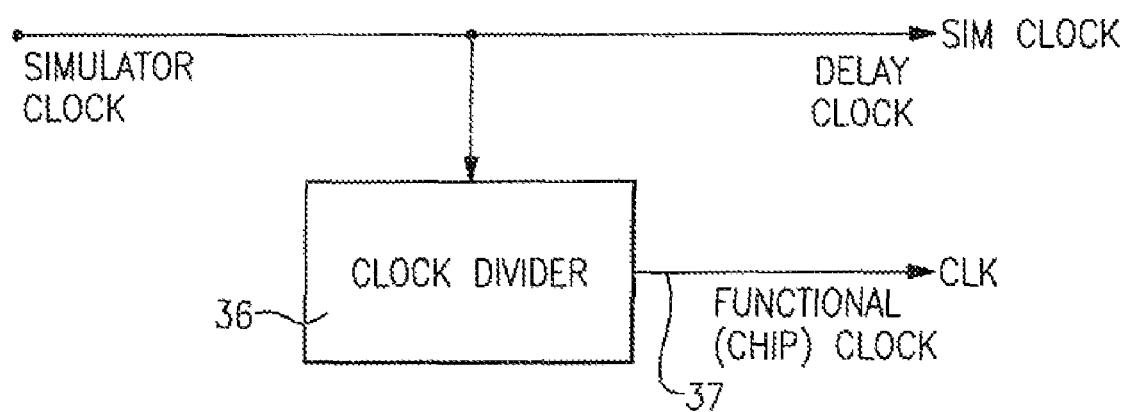
FIG. 7 showing a scheme of a clock divider.

After inserting the delay latches 15, 16, 17 (FIG. 3) into the cycle based simulation model 34 (FIG. 1), preferably a clock divider 36, as shown in FIG. 7, is added to the design proto.

The simulator clock, which is the fastest running clock in simulation, is used as simulator clock signal Sim clock to clock the delay latches 15, 16, 17. Thus the simulator clock signal Sim clock that after the clock divider 36 is forwarded to the delay latches is also labeled Delay Clock in FIG. 7. Also from the simulator clock, the functional chip clock, i.e. the logic clock signal Clk is derived by dividing the simulator clock by a factor of n, where n is the granularity required to model the delays in the simulation model. Thereby the functional chip clock is 1/nth of the simulator clock.

After adding the components for timing simulation to the design proto, it is necessary to connect these to the different clock sources used for simulation. For that, the delay latches 15, 16, 17 are connected to the Delay Clock, which is the simulator clock Sim clock, and the chip clock, i.e. the functional clock, is connected to the clock divider 36 output 37. As for the delay latch insertion shown above, Bugspray code is used to create the connections.

Figure 8:
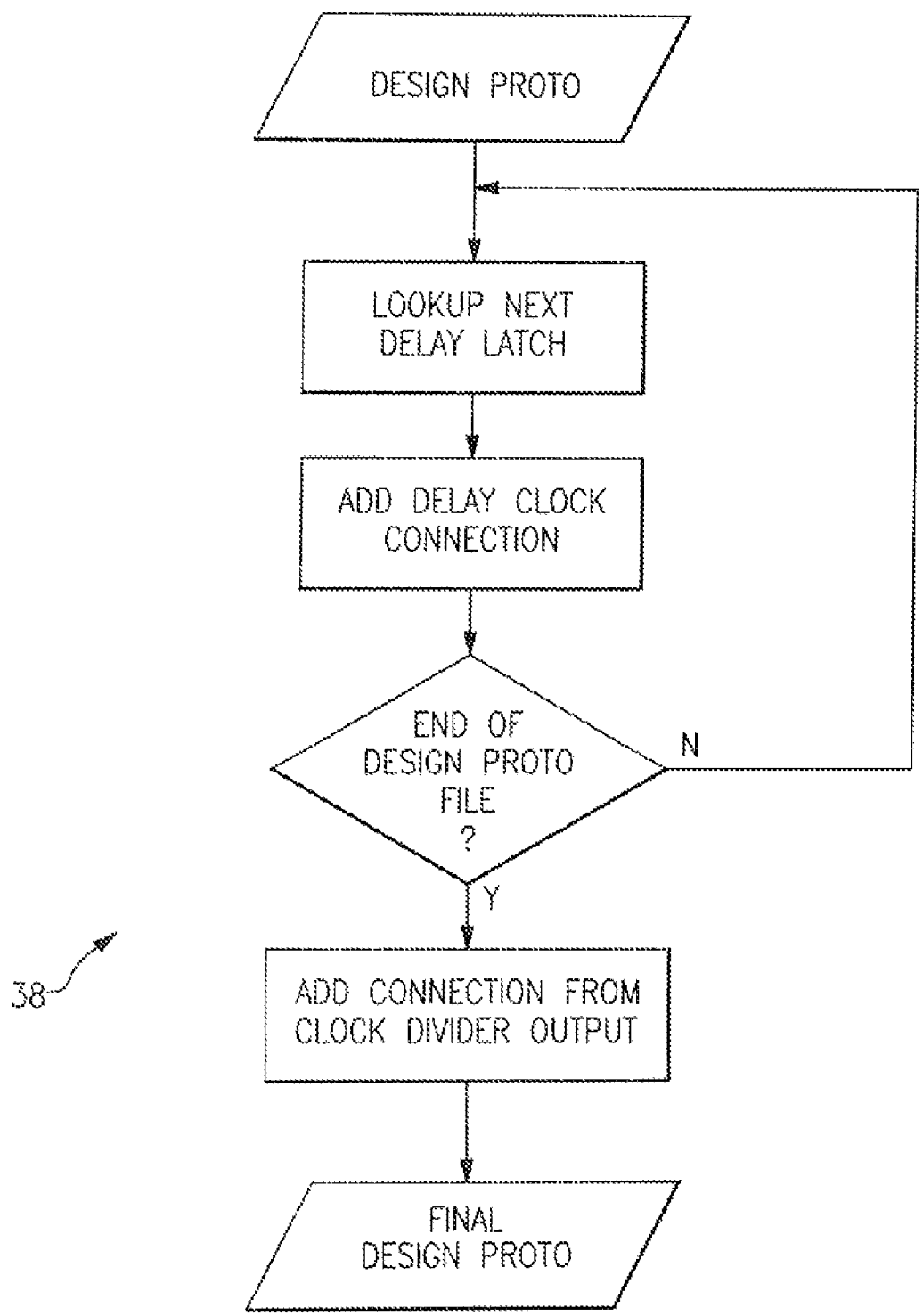
FIG. 8 showing a flowchart of adding a clock divider in an intermediate simulation model.

The procedure of adding the clock divider into an intermediate simulation model, which here is a design proto, is illustrated in the flowchart 38 shown in FIG. 8.

Finally, the resulting design proto is written to disk. It now contains the delay latches modeling the timing delays with a modified clock structure. To generate a simulation model from the Design Proto, standard tools for model build can be used.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

We claim

1. A cycle simulation method for simulating an operation of a digital circuit, wherein a simulation model comprises a plurality of simulated latches representing a corresponding plurality of latch circuits to be modeled, the plurality of simulated latches having corresponding simulated inputs and corresponding simulated outputs, the plurality of simulated latches comprising a first simulated latch having a first simulated output and a second simulated latch having a second simulated input, wherein the first simulated output is connected by a simulated first logic path to the second simulated input, the method comprising:

inserting simulated delay latches into corresponding paths of the plurality of simulated latches, the inserted simulated delay latches comprising a first simulated delay latch inserted in the simulated first logic path between the first simulated output and the second simulated input, the first simulated delay latch representing a logic delay of the digital circuit;

simulating, by any one of a workstation or an accelerator machine, synchronous clocks of the digital circuit, the simulated synchronous clocks clocking the simulated latches, the simulated synchronous clocks corresponding to functional clocks of the digital circuit;

simulating clocking of the inserted simulated delay latches using a delay latch clock to clock the inserted simulated delay latches, wherein each simulated delay latch delays the propagation of a simulated signal by a cycle of the delay latch clock, wherein a first signal of the first simulated output is propagated from the first simulated output to the first simulated delay latch by the delay latch clock and then clocked to the second simulated input by a simulated synchronous clock, such that a logic delay of the simulated first logic path is simulated; and running a simulation of the digital circuit using the simulation model to produce a simulation report based on simulated delays of said simulated delay latches.

2. The method according to claim 1, wherein the delay latch clock is faster than the simulated synchronous clock.

3. The method according to claim 2, wherein the delay latch clock is generated by dividing a simulated synchronous clock cycle into several delay latch clock cycles, wherein the delay latch clock is used to clock the simulated delay latches in sub-cycles of the simulated synchronous clock cycle.

4. The method according to claim 3, wherein in order to have a delay latch clock with simulated synchronous clock cycles subdivided into an appropriate number of delay latch clock cycles, the simulated synchronous clock cycles is generated by delaying the delay latch clock.

5. The method according to claim 3, wherein depending on a ratio of the simulated synchronous clock cycle to the delay latch clock cycle, timing delays are modeled with a required granularity.

6. The method according to claim 1, wherein the delay latch clock has clock cycles corresponding to a smallest delay time of a component of the digital circuit.

7. The method according to claim 1, wherein that the delay latch clock has clock cycles corresponding to a smallest difference in delay times of at least two components of the digital circuit.

8. The method according to claim 1, wherein simulated delay latches are inserted into the simulation model by inserting them into a simulated signal path of the simulated digital circuit.

9. The method according to claim 1, wherein the simulated delay latches are inserted according to timing information specified by a timing report.

10. The method according to claim 1, comprising:

inserting a first series of simulated delay latches in the simulated first logic path, the first series of simulated delay latches comprising a first simulated delay latch, the first series of simulated delay latches representing a logic delay of the digital circuit corresponding to delay of the simulated first logic path; and inserting a second series of simulated delay latches in a simulated second logic path, the second series of simulated delay latches corresponding to delay of the simulated second logic path.

11. A cycle simulation computer program product for simulating an operation of a digital circuit, the computer program product comprising:

a storage medium readable by a processing circuit and storing instructions for execution by the processing circuit for performing a method comprising:

in a simulation model comprising a plurality of simulated latches representing a corresponding plurality of latch circuits to be modeled, the plurality of simulated latches having corresponding simulated inputs and corresponding simulated outputs, the plurality of simulated latches comprising a first simulated latch having a first simulated output and a second simulated latch having a second simulated input, wherein the first simulated output is connected by a simulated first logic path to the second simulated input, inserting simulated delay latches into corresponding paths of the plurality of simulated latches, the inserted simulated delay latches comprising a first simulated delay latch inserted in the simulated first logic path between the first simulated output and the second simulated input, the first simulated delay latch representing a logic delay of the digital circuit;

simulating synchronous clocks of the digital circuit, the simulated synchronous clocks clocking the simulated latches, the simulated synchronous clocks corresponding to functional clocks of the digital circuit;

simulating clocking of the inserted simulated delay latches using a delay latch clock to clock the inserted simulated delay latches, wherein each simulated delay latch delays the propagation of a simulated signal by a cycle of the delay latch clock, wherein a first signal of the first simulated output is propagated from the first simulated output to the first simulated delay latch by the delay latch clock and then clocked to the second simulated input by a simulated synchronous clock, such that a logic delay of the simulated first logic path is simulated; and running a simulation of the digital circuit using the simulation model to produce a simulation report based on simulated delays of said simulated delay latches.

12. The computer program product according to claim 11, wherein the delay latch clock is generated by dividing a simulated synchronous clock cycle into several delay latch clock cycles, wherein the delay latch clock is used to clock the simulated delay latches in sub-cycles of the simulated synchronous clock cycle.

13. The computer program product according to claim 11, wherein the delay latch clock has clock cycles corresponding to a smallest delay time of a component of the digital circuit.

14. The computer program product according to claim 11, wherein that the delay latch clock has clock cycles corresponding to a smallest difference in delay times of at least two components of the digital circuit.

15. The computer program product according to claim 11, comprising:

inserting a first series of simulated delay latches in the simulated first logic path, the first series of simulated delay latches comprising a first simulated delay latch, the first series of simulated delay latches representing a logic delay of the digital circuit corresponding to delay of the simulated first logic path; and inserting a second series of simulated delay latches in a simulated second logic path, the second series of simulated delay latches corresponding to delay of the simulated second logic path.

16. A cycle simulation system for simulating an operation of a digital circuit, the system comprising a computer having a simulation model comprising a plurality of simulated latches representing a corresponding plurality of latch circuits to be modeled, the plurality of simulated latches having corresponding simulated inputs and corresponding simulated outputs, the plurality of simulated latches comprising a first simulated latch having a first simulated output and a second simulated latch having a second simulated input, wherein the first simulated output is connected by a simulated first logic path to the second simulated input, the system capable of performing a method comprising:

inserting simulated delay latches into corresponding paths of the plurality of simulated latches, the inserted simulated delay latches comprising a first simulated delay latch inserted in the simulated first logic path between the first simulated output and the second simulated input, the first simulated delay latch representing a logic delay of the digital circuit;

simulating synchronous clocks of the digital circuit, the simulated synchronous clocks clocking the simulated latches, the simulated synchronous clocks corresponding to functional clocks of the digital circuit;

simulating clocking of the inserted simulated delay latches using a delay latch clock to clock the inserted simulated delay latches, wherein each simulated delay latch delays the propagation of a simulated signal by a cycle of the delay latch clock, wherein a first signal of the first simulated output is propagated from the first simulated output to the first simulated delay latch by the delay latch clock and then clocked to the second simulated input by a simulated synchronous clock, such that a logic delay of the simulated first logic path is simulated; and running a simulation of the digital circuit using the simulation model to produce a simulation report based on simulated delays of said simulated delay latches.

17. The system product according to claim 16, wherein the delay latch clock is generated by dividing a simulated synchronous clock cycle into several delay latch clock cycles, wherein the delay latch clock is used to clock the simulated delay latches in sub-cycles of the simulated synchronous clock cycle.

18. The system according to claim 16, wherein the delay latch clock has clock cycles corresponding to a smallest delay time of a component of the digital circuit.

19. The system according to claim 16, wherein that the delay latch clock has clock cycles corresponding to a smallest difference in delay times of at least two components of the digital circuit.

20. The system according to claim 16, comprising:

inserting a first series of simulated delay latches in the simulated first logic path, the first series of simulated delay latches comprising a first simulated delay latch, the series of simulated delay latches representing a logic delay of the digital circuit corresponding to delay of the simulated first logic path; and inserting a second series of simulated delay latches in a simulated second logic path, the second series of simulated delay latches corresponding to delay of the simulated second logic path.

\* \* \* \* \*